United States Patent [19]

Katsura et al.

[11] Patent Number: 4,804,834
[45] Date of Patent: Feb. 14, 1989

[54] PHOTOSENSOR HAVING PHOTOSENSITIVE PART FORMED OF PURPLE MEMBRANE

[75] Inventors: Tatsuo Katsura; Hideatsu Maeda; Tsukasa Sakai; Keishiro Tsuda, all of Ibaraki, Japan

[73] Assignees: Agency of Industrial Science & Technology; Ministry of International Trade & Industry, both of Tokyo, Japan

[21] Appl. No.: 177,897

[22] Filed: Mar. 31, 1988

Related U.S. Application Data

[63] Continuation of Ser. No. 906,439, Sep. 12, 1986, abandoned.

[30] Foreign Application Priority Data

Sep. 14, 1985 [JP] Japan .................. 60-203868

[51] Int. Cl.$^4$ ........................... H01J 40/14
[52] U.S. Cl. ..................... 250/211 R; 356/8
[58] Field of Search .............. 250/214 A, 211; 136/263; 356/8; 430/495

[56] References Cited

U.S. PATENT DOCUMENTS

| | | | |
|---|---|---|---|
| 3,770,968 | 11/1973 | Hession et al. | 250/214 A |
| 3,995,174 | 11/1976 | Zrudsky | 307/584 |
| 4,303,831 | 12/1981 | El Hamamsy | 250/551 |
| 4,363,963 | 12/1982 | Ando | 357/30 H |
| 4,420,724 | 12/1983 | Owen | 250/214 A |

OTHER PUBLICATIONS

Varo ("Dried Oriented Purple Membrane Samples", Institute of Biophysics, Biological Research Center, Szeged, 1981) (Acta biol. Acad. Sci. hung. 32 (3-4)), 301-310 (1981).

Biochemical and Biophysical Research Communications, Karoly Nagy, "Photoelectric Activity of Dried, Oriented Layers of Purple Membrane from Halobacterium Halobium", vol. 85, No. 1, 1978, Nov. 14, 1978, pp. 383-390.

Institute of Biophysics, Biological Research Center, Szedged, Hungary, G. Varo and L. Keszthelyi, "Photoelectric Signals from Dried Oriented Purple Membranes of Halobacterium Halobium", vol. 43, Jul. 1983, pp. 47-51.

Department of Biophysics, The Ohio State University, Brian M. Becher and Joseph Y. Cassim, "Improved Isolation Procedures for the Purple Membrane of Halobacterium Halobium", Preparative Biochemistry, 5(2), 1975, pp. 161-178.

Primary Examiner—Edward P. Westin
Assistant Examiner—Khaled Shami
Attorney, Agent, or Firm—Oblon, Fisher, Spivak, McClelland & Maier

[57] ABSTRACT

A photosensor uses as a photosensitive part thereof a purple membrane film which contains bacteriorhodopsin isolated from a highly halophilic bacterium and which generates a photoelectromotive force corresponding to the intensity of light absorbed, and uses as an amplifying part an FET.

3 Claims, 3 Drawing Sheets

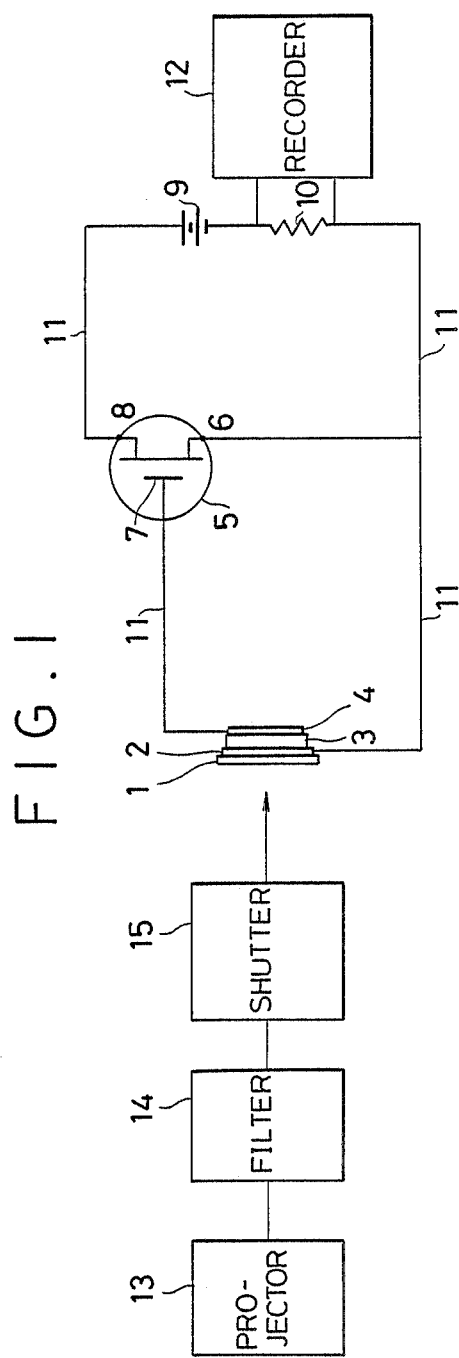
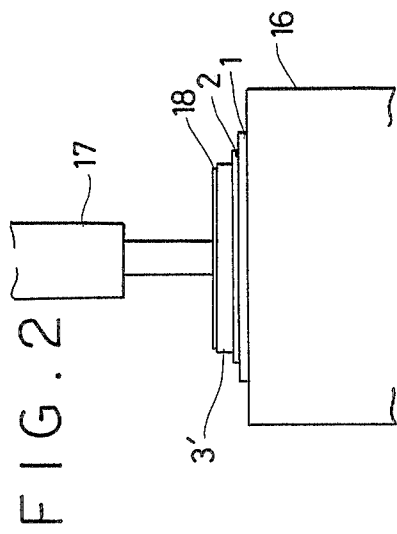

PHOTOSENSOR HAVING PHOTOSENSITIVE PART FORMED OF PURPLE MEMBRANE

This application is a continuation of application Ser. No. 906,439, filed on Sept. 12, 1986, now abandoned.

FIELD OF THE INVENTION AND RELATED ART STATEMENT

This invention relates to a photosensor which detects light and converts the detected light into an electric signal corresponding to the intensity of the light.

The photosensors heretofore known to the art may be roughly classified by the principle of photoelectric conversion into the following three groups.
(i) Photosensors utilizing the photo-emissive effect
(ii) Photosensors utilizing the photoconductive effect
(iii) Photosensors utilizing the photovoltaic effect The devices of the type (i) include photoelectric cells and photomultipliers and those of the type (ii) include photoconductive cells using CdS and PbS as conversion elements. The devices of the type (iii) include photodiodes and phototransistors.

These photosensors possess many good points, such as an ability to sense feeble light and an ability to convert rapidly changing light signals into electric signals. In many of these photosensors, the dependency of photosensitivity upon wavelength differs from the dependency of human visual sensitivity upon wavelength. Therefore, depending on the purpose of application, for example, to attain wavelength characteristics similar to the visual sensitivity, it has been necessary for such photosensors to be used in combination with a filter.

Reports on the preparation of cell membrane fragments (purple membrane films) which contain bacteriorhodopsin having retinal (vitamin A aldehyde) as a chromophore similar to human rhodopsin and the investigation of the cell membrane fragments with respect to photoelectric conversion characteristics have been known in the art (such as, for example, Biochem. Biophys. Res. Commun., 85, (1978), K. Nagy, pp. 383–390 and Biophys. J., 43, (1983), G. Vérő et al., pp. 47–51).

OBJECT AND SUMMARY OF THE INVENTION

An object of this invention is to provide a photosensor which possesses wavelength characteristics similar to the human visual sensitivity.

The photosensor of this invention comprises a photosensitive part formed of cell membrane fragments (purple membrane fragments) containing bacteriorhodopsin isolated from highly halophilic bacteria and having an ability to absorb light and generate a photoelectromotive force corresponding to the intensity of the absorbed light and a detecting-amplifying part formed of a field effect type transistor capable of detecting and amplifying the photoelectromotive force generated in the aforementioned photosensitive part.

The aforementioned purple membrane fragments containing bacteriorhodopsin possesses an absorption peak similarly to the human rhodopsin, near 560 nm, and exhibits sensitivity to light of a wavelength in the range of 400 nm to 700 nm and, therefore, permits detection of light of the intensity proper to the human visual sensitivity to be effected with a device of a very simple structure without requiring use of a filter or other similar aid.

The above and other objects and features of the invention will become more apparent from the following detailed description with reference to the accompanying drawings.

BRIEF DESCRIPTION OF THE DRAWINGS

FIG. 1 is a schematic structural diagram illustrating a photosensor in one embodiment of this invention.

FIG. 2 is an explanatory diagram illustrating electrodeposition of the purple membrane films of the photosensor of the present invention.

DETAILED DESCRIPTION OF THE PREFERRED EMBODIMENT

Figure 3:
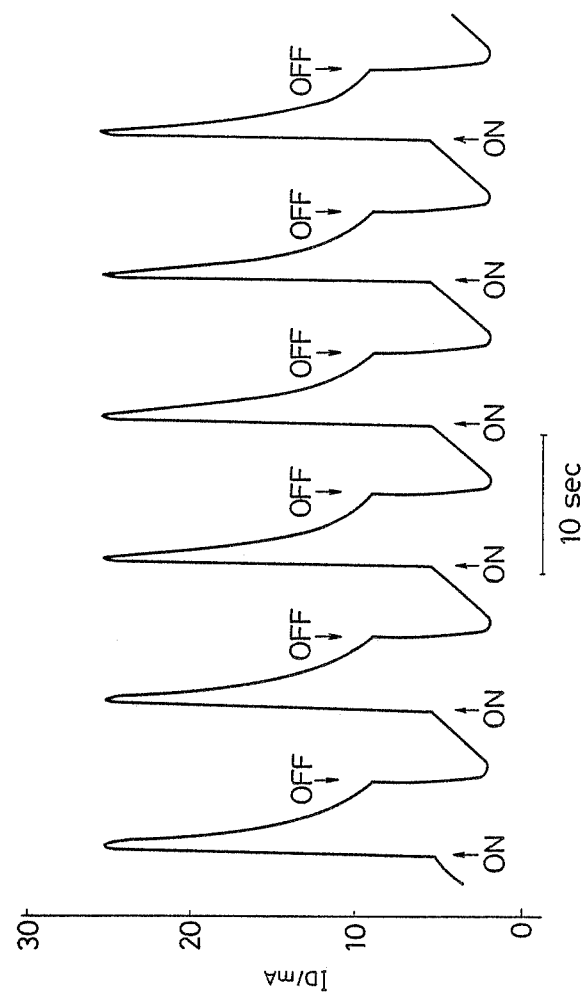
FIG. 3 is a graph showing the relation between the irradiation of light upon the photosensor of this invention and the output current.

FIG. 1 represents a structural diagram of a photosensor according to this invention. A thin layer 3 of purple membrane fragments (hereinafter referred to as a "purple membrane film") which contain bacteriorhodopsin isolated from highly halophilic bacteria is electrodeposited on a first transparent electrode 2 which has been vacuum deposited on a glass substrate 1. A second electrode 4 is further vacuum deposited on the purple membrane film 3. The first electrode 2, the purple membrane film 3, and the second electrode 4 jointly make a photosensitive part. A field effect type transistor (FET) 5 has a source 6 and a gate 7 which are connected respectively to the first transparent electrode 2 and the second electrode 4 through the medium of a conductor circuit 11. A drain 8 of the FET is connected via a DC power source 9 and a resistor 10 to the source 6 of the FET through the medium of the conductive circuit 11, to give rise to a detecting-amplifying part for detecting and amplifying the photoelectromotive force generated in the photosensitive part. The change in the drain current $I_D$ in consequence of the irradiation of light upon the photosensitive part is recorded in a recorder 12 in the form of variations of two terminal voltages of the resistor 10.

The purple membrane film containing bacteriorhodopsin is isolated from a highly halophilic bacterium. Halobacterium salinarium deposited with ATCC under ATCC No. 33171 can be used as the highly halophilic bacterium.

The isolation of the purple membrane fragments from the highly halophilic bacteria can be effected, for example, by the method disclosed in Preparative Biochem., 5, (1975), B. M. Becher et al., pp. 161–171. Specifically, the highly halophilic bacteria are cultured in a medium containing a salt in a high concentration under irradiation of light. The cultured bacterium is collected by centrifugation and then dialyzed against an aqueous solution containing NaCl in a concentration of about 0.1M. Consequently, the bacterial cells are ruptured and made to release purple membrane fragments, nucleic acid, proteins, etc., causing the aqueous solution to change to a reddish-brown color. When this aqueous solution is further centrifuged (25,000 rpm), the purple membrane fragments are sedimented and separated from proteins, nucleic acid, etc. The purple membrane fragments are further subjected to sucrose density gradient centrifugation for further removal of impurities.

Consequently, disc-shaped purple membrane fragments having an average diameter of about 0.5 μm and a thickness of about 40 Å are obtained.

the formation of the purple membrane film by electrodeposition of the purple membrane fragments on the first transparent electrode 2 vacuum deposited on the glass substrate 1 is accomplished by mounting a transparent electrode 2 on an electrode holder 16 as illustrated in FIG. 2, dropping a liquid 3' containing the purple membrane fragments onto the transparent electrode 2, lowering a micrometer head 17 disposed above the holder 16 thereby allowing an electrodepositing electrode 18 fixed at the leading end of the micrometer head 17 to approach the transparent electrode 2 until the electrode contacts the liquid 3' thereby forming a circular column of the liquid depressed at the center thereof by virtue of surface tension, further narrowing the gap between the two electrodes until the thickness of the liquid decreases to a prescribed level, and applying a DC voltage between the two electrodes 2, 18 thereby allowing the purple membrane fragments in the liquid to undergo orientation in an electric field, electrophoresis, and electrodeposition on the electrode 2. The polarity of the voltage applied in this case is to be decided, with due consideration paid to the polarity possessed by the purple membrane fragments, so that the electrically charged purple membrane fragments will be electrodeposited on the electrode 2. When the purple membrane fragments electrodeposited on the electrode as described above are deprived of the entrained liquid and dried, the purple membrane film 3 is formed on the transparent electrode. As the first transparent electrode to be formed on the aforementioned glass substrate 1, a $In_2O_3$-vacuum deposited film, a $SnO_2$-vacuum deposited film, a Au-vacuum deposited film, etc. which have been known to the art can be effectively adopted. Although the second electrode to be formed on the purple membrane film 3 can be attained by spattering Au, it may also be obtained by vacuum evaporating Al, In, Sn, etc.

The electric signal corresponding to the intensity of the light detected and issued as an output by the photosensitive part is amplified by a field effect type transistor (FET). Any of the commercially available FET's can be satisfactorily adopted for the purpose of this amplification. Among other FET's, MOS FET's prove particularly desirable. In the MOS FET 5 of FIG. 1, the first transparent electrode 2 is connected to the source 6 and the second electrode 4 is connected to the gate 7. The DC power source 9 is connected to the drain 8 and the source 6 of the FET.

In the photosensor constructed as described above, when a visible light impinges through the transparent electrode 2 on the glass substrate 1 upon the purple membrane film 3, the potential induced by the purple membrane film is applied to the gate to control the drain current flowing between the drain and the source. The consequent variation in the magnitude of the electric current is recorded on the recorder 12. During continuous projection of the visible light on the purple membrane, a potential difference on the order of several volts is generated for a duration on the order of milliseconds owing to photopolarization of bateriorhodopsin. The water molecules and protons which are present inside the purple membrane film are rearranged so as to cancel this photopolarization potential and, as a result, the apparent potential difference is erased after some tens of seconds. When the projection of the light is discontinued, the potential difference due to photopolarization ceases to exist. The rearrangement of the water molecules and the protons, however, induces a potential of opposite polarity. Gradually this potential dwindles to nothing and the initial state returns. By providing the photosensitive part with a shutter adapted to admit light at intervals of several seconds, therefore, the photosensor is enabled to measure the intensity of light accurately.

As is clear from the description given so far, the present invention produces a photosensor possessing wavelength characteristics falling substantially in the same range as the human visual sensitivity because it uses as a photoelectric conversion element a purple membrane film which contains bacteriorhodopsin having a chromophore which is the same as that of a human rhodopsin. This photosensor can be used not only as a detector for visible light but also as a data input device utilizing light. The illustrated embodiment has been depicted as possessing a configuration in which the output signal from the photosensitive part is conveyed to the gate electrode of the FET with an electric wire. Optionally, the photosensor can be integrated to a higher degree by modifying the configuration so that the photosensitive part will be disposed directly on the gate of the FET.

Now, the present invention will be described below with reference to an example. It should be noted, however, that this invention is not limited to the following example.

EXAMPLE

A highly halophilic bacterium, Halobacterium salinarium (ATCC No. 33171), was inoculated into a culture medium containing NaCl at a ratio of 2.5 kg per 10 liters of a culture broth held in a container of acryl resin and was cultured at about 40° C. for about 120 hours in the presence of a low concentration of oxygen under the light from sixteen 20 W fluorescent lamps. Then, the culture broth was treated with a centrifuge operated at 8,000 rpm for 20 minutes to separate cells. The cells and D Nase were placed in a dialyzing tube (Visking tube) and dialyzed overnight against a 0.1M aqueous NaCl solution. During the dialysis, the cells were ruptured to release purple membrane fragments, proteins, nucleic acid, etc., turning the solution into a reddish purple color. This solution was treated with an ultracentrifuge operated at 25,000 rpm for 30 minutes, thereby separating the solution into a reddish orange supernatant and sedimented purple membrane fragments. The purple membrane fragments were again treated with the ultracentrifuge. This procedure was repeated until a transparent supernatant was obtained. The purple membrane fragments obtained as described above were subjected to centrifugation of sucrose density gradient at 25,000 rpm for 17 hours to ensure thorough removal of impurities sedimented jointly with the purple membrane fragments. The isolated purple membrane fragments were thoroughly washed with water. Consequently, disc-shaped purple membrane fragments averaging 0.5 μm in diameter and 40 Å in thickness were obtained.

Then, on a glass substrate, a circular $In_2O_3$ film 20 mm in diameter was vacuum deposited as a transparent electrode. The solution containing the purple membrane fragments was dropped onto the $In_2O_3$ film. In an apparatus constructed as illustrated in FIG. 2, a micrometer head was lowered until the dropped solution formed a circular column having the same diameter as the In$_2$O$_3$ film. Subsequently, a DC voltage of 3.0 V was applied between the micrometer head's electrodepositing platinum electrode and the transparent In$_2$O$_3$ electrode to effect electrodeposition of purple membrane fragments on the In$_2$O$_3$ electrode. The electrodeposited product was then dried. The electrodeposited purple membrane film thus produced had a thickness of about 2 μm. On this purple membrane film, Au was deposited as the second electrode by spattering.

Then, the In$_2$O$_3$ electrode and the Au electrode were connected respectively to the source and the gate of the MOS type FET 3SK20 ⒽⒾ with tin foil and a DC voltage of 6.75 V was applied between the source and the drain of the FET. The light from a 750-W projector 13 was passed through a filter 14 adapted to intercept infrared rays and interrupted by a shutter 15 serving to allow the light to impinge intermittently on the purple membrane film at intervals of 5 seconds. The drain current I$_D$ of the FET recorded on the recorder 12 was as shown in FIG. 3. From this chart, it is noted that in consequence of the ON-OFF projection of visible light at intervals of 5 seconds, a potential was induced by the bacteriorhodopsin in the purple membrane film during each cycle of projection and a drain current of about 25 mA flowed in the FET for each occurrence of the potential.

Figure 4:
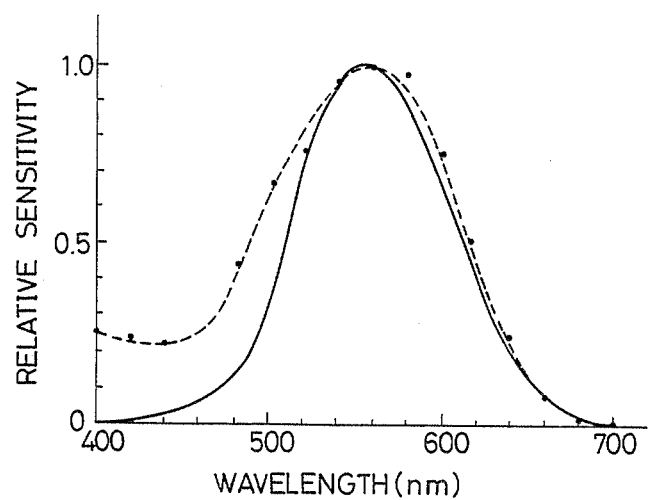
FIG. 4 is a graph showing the dependency of the sensitivity of the photosensor of this invention upon wavelength.

FIG. 4 is a graph showing the results of the measurement of dependency of the photosensor's sensitivity upon wavelength. The dotted curve represents the data obtained in an experiment conducted by varying the wavelength of a light emitted from the projector sequentially from 400 to 700 nm with an interference filter and compensating the difference of drain currents (ΔI$_D$) during the dark and bright periods at a varying wavelength with respect to the light energy of that particular wavelength. The solid curve represents the data of human relative luminosity curve. Both the curves shows the values of relative sensitivity, with the values at wavelength 550 nm each taken as 1.0. From these two curves, it is inferred that the photosensor of this invention is sensitive to the light of wavelengths ranging from 400 to 700 nm and reaches a peak at 560 nm, similar to the human visual sensitivity.

Figure 5:
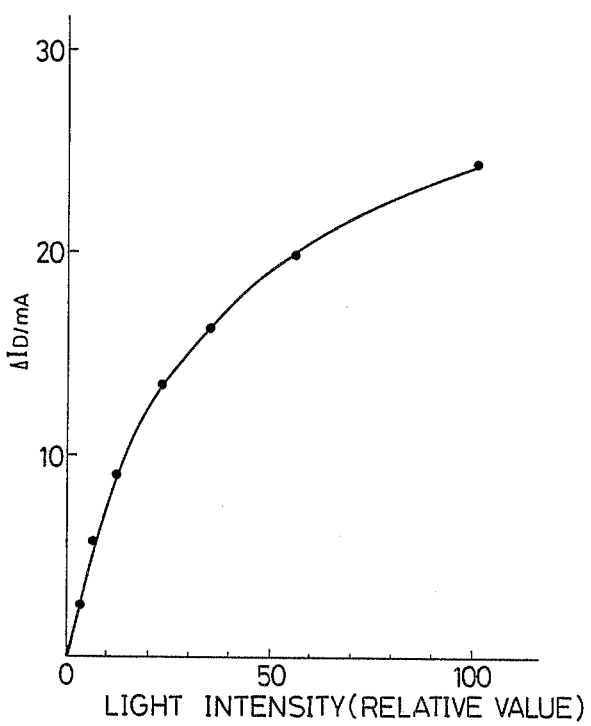
FIG. 5 is a graph showing the relation between the intensity of the light irradiated on the photosensor of this invention and the output current.

FIG. 5 is a graph showing the relation between the intensity of light projected on the photosensor and the drain current of the FET recorded on the recorder, as obtained by adjusting the light from the projector with ND filters, measuring the light energy of the adjusted light with a commercially available power meter, and plotting the numerical values obtained, with the horizontal axis as the scale of light intensity using 0 as the intensity existing during the dark period and 100 as the intensity existing during the absence of the use of the ND filter and the vertical axis as the scale of drain current flowing in the FET. It is noted from the graph of FIG. 5 that the photosensor of this invention is capable of obtaining electric signals corresponding to the intensities of light projected.

What is claimed is:
1. A photosensor comprising:
    a photosensitive part including a transparent electrode, purple membrane containing bacteriorhodopsin which is isolated from a highly halophilic bacterium and having an ability to absorb light and generate photoelectromotive force corresponding to the intensity of the absorbed light, said purple membrane being electrodeposited on said transparent electrode to form a purple membrane film, and a second electrode deposited on a surface of said purple membrane film opposite the surface thereof facing said transparent electrode,
    means for intermittently projecting light to be measured on said purple membrane film, and
    a FET having a source and a gate which are connected respectively to said transparent electrode and said second electrode.
2. A photosensor according to claim 1, wherein said FET is a MOS FET.
3. A photosensor according to claim 1, wherein said purple membrane film electrodeposited on said transparent electrode has a thickness of about 12 μm.

* * * * *